United States Patent [19]

Itoh

[11] Patent Number: 4,638,458

[45] Date of Patent: Jan. 20, 1987

[54] SEMICONDUCTOR MEMORY ADDRESS LINES WITH VARIED INTERVAL CONTACT HOLES

[75] Inventor: Yasuo Itoh, Yokohama, Japan

[73] Assignee: Kabushiki Kaisha Toshiba, Kawasaki, Japan

[21] Appl. No.: 715,360

[22] Filed: Mar. 25, 1985

[30] Foreign Application Priority Data

Mar. 30, 1984 [JP] Japan .................................. 59-62730

[51] Int. Cl.$^4$ ............................................... G11C 5/10
[52] U.S. Cl. ......................................... 365/51; 357/71
[58] Field of Search ......................... 365/51, 149, 189; 357/71

[56] References Cited

U.S. PATENT DOCUMENTS 4,278,989 7/1981 Baba et al. ............................ 357/59
4,481,524 11/1984 Tsujide .................................. 365/156
4,587,549 5/1986 Ushiku .................................. 357/71

FOREIGN PATENT DOCUMENTS

3002343 7/1980 Fed. Rep. of Germany ...... 365/156
199557 11/1983 Japan ..................................... 365/51

Primary Examiner—James W. Moffitt
Attorney, Agent, or Firm—Oblon, Fisher, Spivak, McClelland, & Maier

[57] ABSTRACT

According to a memory of the invention which can read/write data, word lines are connected to memory cells arranged on a semiconductor substrate. Each word line has a double layered structure comprising first and second conductive lines. An insulative layer is sandwiched between the conductive lines. Since the insulative layer has a plurality of contact holes formed along the extended direction of the first and second lines and spaced by an irregular pitch, the stacked lines are discontinuously and electrically connected to each other through these contact holes.

5 Claims, 9 Drawing Figures

SEMICONDUCTOR MEMORY ADDRESS LINES WITH VARIED INTERVAL CONTACT HOLES

BACKGROUND OF THE INVENTION

The present invention relates to a semiconductor memory device and, more particularly, to a semiconductor memory device which is integrated on a large scale for high-speed data access.

Various semiconductor memories are known which can read/write data. A typical example of such a semiconductor memory is a dynamic random-access memory (d-RAM) which comprises a matrix of memory cells each consisting of a transistor and capacitor. The memory capacity of the d-RAM chip has recently increased, and integration of memory cells on the d-RAM chip has improved to, e.g., 64 kbit, 256 kbit.

With the high integration of the d-RAM, it is increasingly difficult to keep data access speed high. This is because, signal transfer delay on each word line increases in accordance with an increase in the memory integration of the d-RAM. When the memory cell number per word line is increased, the chip size is enlarged and the length of each word line is increased. In an extreme case, the length of the word line becomes the maximum possible, i.e., as long as one side of the memory chip. As a result, not only the resistance of the word line but also the capacitance between the wiring layer and the chip substrate are increased, thus preventing high speed signal transfer.

When the word lines are formed of polycrystalline silicon, the delay in the signal transfer is particularly serious. This is because there is a large difference (which cannot be permitted in the normal memory operation) between the signal transfer speed at an end portion (i.e., start end portion) at a driving circuit side of the word line of polycrystalline silicon having a larger resistance than that of a metal layer and that at an end portion (terminal portion) farthest from the driving circuit. In the d-RAM, even if the signal transfer speed at the start end portion of the word line is high, if that at its terminal portion is low, the data access speed of the overall memory is determined by the low signal transfer speed at the terminal portion of the word line. A timing design of the d-RAM must be performed with reference to a portion with the lowest signal transfer speed. Therefore, in the conventional device, improvement in data access speed of a highly integrated d-RAM cannot be satisfactorily achieved.

In order to prevent signal transfer delay in the word line, specific materials having low resistance, e.g., a high melting point metal such as tungsten (W), molybdenum (Mo) or the like can be used as a wiring material. However, a method of manufactured a wiring layer using such a metal (called "MOCVD") has not been fully established and still presents some difficulties in practice. In order to solve the above problem, a so-called "word line divisional driving method" is proposed in which word lines are divided into groups and a driving circuit is provided for each word line group. However, in this method, the circuit configuration of driving circuits is complex and the area of peripheral circuits (including the decoder) is undesirably increased, thus preventing high integration of the d-RAM.

SUMMARY OF THE INVENTION

It is therefore an object of the present invention to provide a new and improved semiconductor memory device which can access data at high speed and can be highly integrated.

It is another object of the present invention to provide a new and improved semiconductor memory device which can access data at a satisfactorily high speed and can be highly integrated without using a specific wiring material with a low resistance or adopting a divisional driving method of word lines.

The semiconductor device comprises memory cells arranged on a semiconductor substrate in a matrix manner. Each memory cell has a memory cell transistor and a memory cell capacitor which is charged so as to reflect the logic state of its memory cell. Address lines are connected to the memory cells and extend on the substrate in column and row directions in a grid form. In order to read/write data from/in a desired memory cell, the address lines select a particular memory cell. According to the present invention, the address lines include double layered address lines. Each double layered address line comprises first and second conductive lines sandwiching an insulative layer therebetween. These conductive lines are vertically stacked and extend along the column or row direction. Note that an end portion of each conductive line for receiving a drive signal for specifying the desired cell is referred to as a first end portion, and an opposite end portion is referred to as a second end portion. The insulative layer has a plurality of contact holes formed along the extending direction of the first and second lines. The first and second lines are electrically connected to each other through these contact holes. The interval between two neighbouring contact holes at the second end portion of each of the first and second lines is set to be smaller than that between two neighbouring contact holes at the first end portion, thereby decreasing a maximum delay time in signal transfer at the second end portion of each double layered address line. Similarly, the interval between the two neighbouring contact holes at the first end portion is increased, thereby preventing an increase in the total number of contact holes.

BRIEF DESCRIPTION OF THE DRAWINGS

The present invention is best understood by reference to the accompanying drawings, in which.

DETAILED DESCRIPTION OF THE PREFERRED EMBODIMENTS

Figure 1:
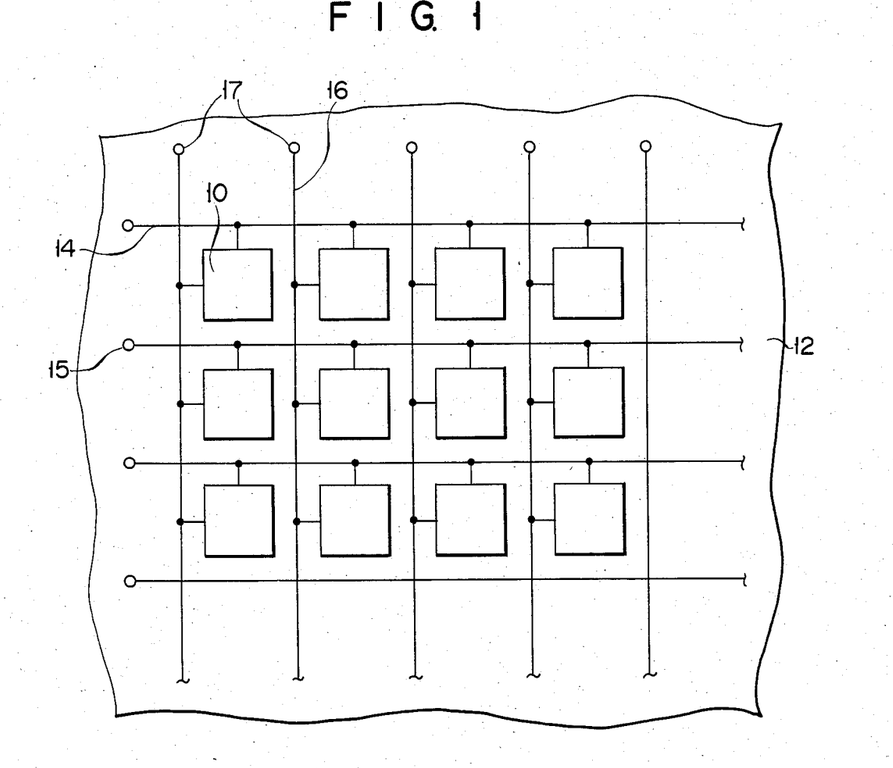
FIG. 1 is a partial enlarged view of a memory cell region of a dynamic random-access memory (referred to as "d-RAM" hereinafter) according to a preferred embodiment of the present invention.
Figure 2:
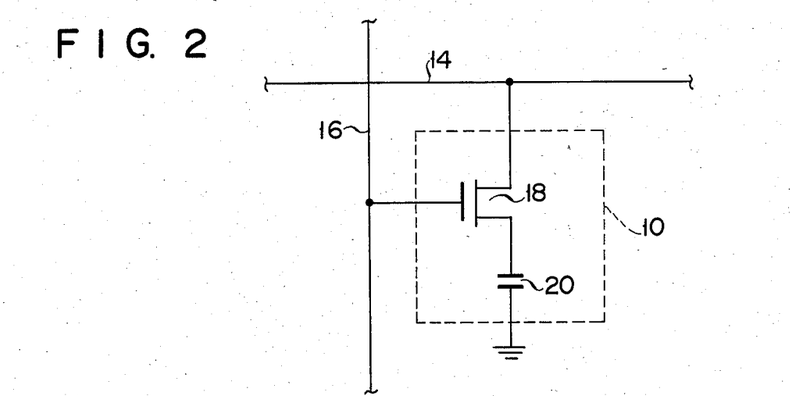
FIG. 2 is an equivalent circuit diagram of one cell of the d-RAM shown in FIG. 1.

In a semiconductor dynamic random-access memory (d-RAM) according to one preferred embodiment of the present invention, memory cells 10 are arranged on a monocrystalline silicon substrate 12 in a matrix manner, as shown in FIG. 1. Row address lines 14 (referred to as "bit lines" hereinafter) and column address lines 16 (referred to as "word lines" hereinafter) run perpendicular to each other on the substrate 12. The bit and word lines 14 and 16 are provided for accessing a selected or particular memory cell. Since a start end 15 of each bit line 14 is connected to a driving circuit (not shown) which includes a decoder and the like formed on the substrate 12, a drive voltage for reading/writing data supplied from the driving circuit in the memory access mode is applied to the start end 15 of each bit line 14. Thereafter, the voltage is transferred through the line 14 toward its terminal. Similarly, since a start end 17 of each word line 16 is connected to the driving circuit, the drive voltage for reading/writing data supplied from the driving circuit in the memory access mode is applied to the start end 17. Thereafter, the voltage is transferred through the line 16 toward its terminal. Each memory cell 10 is connected to the corresponding bit and word lines 14 and 16. Thus, when the desired bit and word lines are activated in response to the supplied drive voltage, data can be read/written at a desired memory address. As illustrated in FIG. 2, each memory cell 10 includes a MOSFET 18 as a memory cell transistor and a MOS capacitor 20 as a memory cell capacitor which is charged to reflect the logic state of the memory cell.

Figure 3:
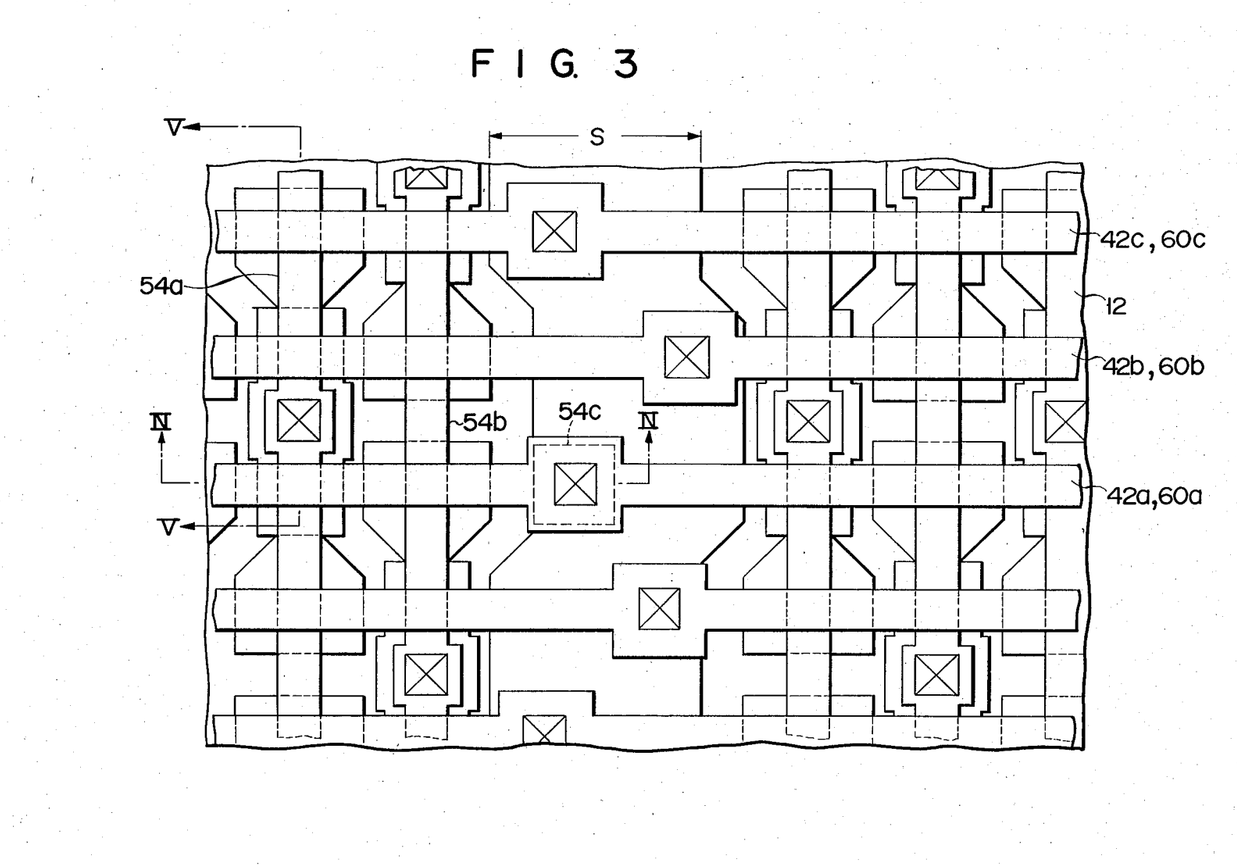
FIG. 3 is an enlarged plan view of a main part of the d-RAM shown in FIG. 1.

FIG. 3 is an enlarged plan view of a main part of the d-RAM according to this embodiment. In FIG. 3, in order to simplify the description, an insulative layer normally formed between respective planar pattern layers is omitted, and portions under the overlying pattern layer which cannot be seen are drawn by dotted lines, thus showing the stacked arrangement of the structure. Note that reference symbol S denotes a noncell region or dead space surrounded by two neighbouring cell regions.

Figure 4:
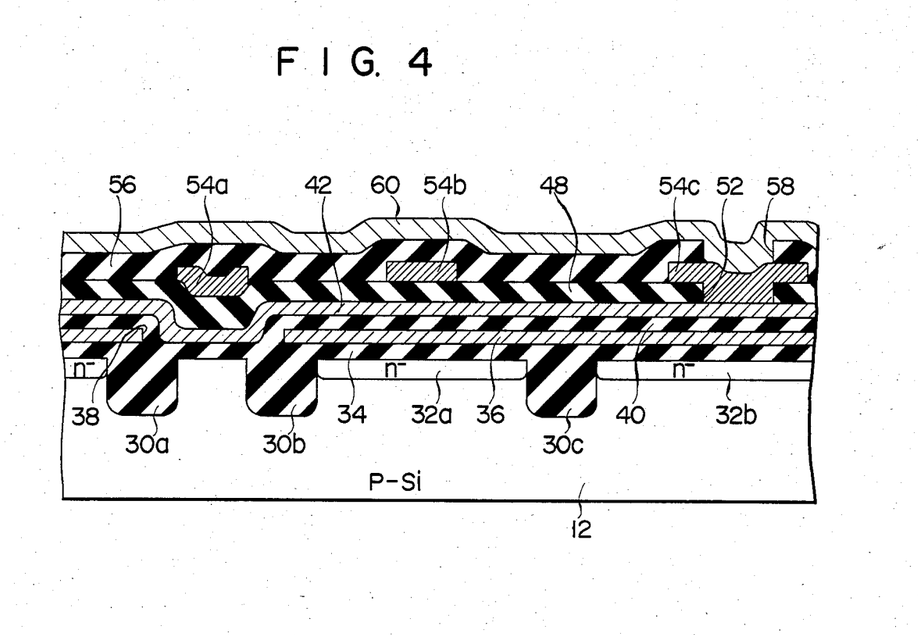
FIG. 4 is a sectional view taken along the line IV—IV of the d-RAM having the structure shown in FIG. 3.
Figure 5:
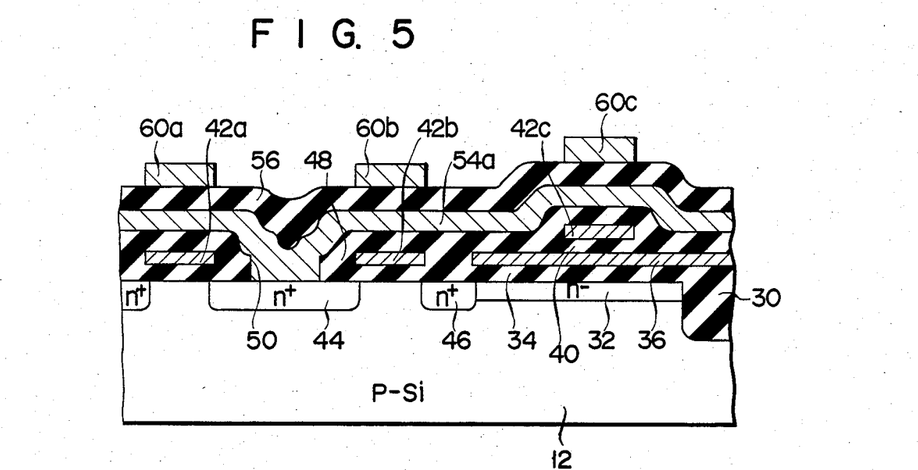
FIG. 5 is a sectional view taken along the line V—V of the d-RAM having the structure shown in FIG. 3.

FIGS. 4 and 5 are respectively sectional views taken along the lines IV—IV and V—V of the planar pattern of FIG. 3. In FIG. 4, the substrate 12 is formed of a monocrystalline silicon film of p conductivity type. Field oxide films 30a, 30b and 30c are formed in a surface of the substrate 12 by a known selective oxidation method or oxide film burying method. Surface portions of the substrate surrounded by the field oxide films 30 correspond to element forming regions. Low impurity layers 32a and 32b of n$^-$ conductivity type are formed in the respective element forming regions surrounded by the field oxide films 30.

A gate oxide film 34 of about 100 Å thickness is formed on the substrate 12 so as to cover the n$^-$ layers 32. A first polycrystalline silicon layer 36 is formed on the gate oxide film 34. Since the polycrystalline silicon layer 36 is patterned so as to cover the n$^-$ layers 32a and 32b at the same time, it can serve as a common MOS capacitor electrode to bit cells formed on the substrate 12. It should be noted that the common capacitor electrode 36 has openings at predetermined positions. In the sectional view of FIG. 4, only one opening 38 can be observed above the substrate surface portion which is surrounded by the field oxide films 30a and 30b and on which no n$^-$ layer is formed.

Another gate oxide film 40 and a second polycrystalline silicon layer 42 are sequentially formed on the top surface of the layer structure including the common capacitor electrode 36. The polycrystalline silicon layer 42 is patterned to obtain a plurality of linear patterned layers 42a, 42b and 42c corresponding to the word lines 16 shown in FIG. 1. FIG. 5 shows sectional shapes of the patterned layers 42. After forming the patterned layers 42, ion-implanation is performed, thereby forming two n$^+$ layers 44 and 46 in the corresponding surface portions of the substrate 12, as illustrated in FIG. 5. The layers 44 and 46 serve as source and drain of the MOSFET as the memory cell transistor, respectively.

A relatively thick oxide film 48 (about 5,000 Å) is formed to cover the second polycrystalline silicon layer 42 by a known CVD method. The oxide film 48 is patterned so as to have a contact hole 50 in a portion corresponding to the n$^+$ layer 44, i.e., the source of the MOSFET. The oxide film 48 also has a plurality of other contact holes 52 allowing contact with the layer 42. In FIG. 4, for the sake of simplicity, only one contact hole 52 is shown.

A highly conductive metal layer (e.g., aluminum layer) 54 is formed on the oxide film 48 and is patterned. As a result, linear patterns 54a and 54b serving as the bit lines in FIG. 1 and a rectangular pad pattern 54c electrically connected to the underlying layer 42 through the contact hole 52 are obtained. A planar shape of the pattern 54c is set to be larger than that of the contact hole 52.

A relatively thick second oxide film 56 (about 5,000 Å) is formed to cover the patterned layers 54a, 54b and 54c by a known CVD method. The second oxide film 56 is patterned so as to form a contact hole 58 therein on the pattern 54c. A highly conductive metal layer (e.g., aluminum layer) 60 is formed on the second oxide film 56. The aluminum layer 60 is patterned so as to obtain linear patterns 60a, 60b and 60c serving as the word lines 16 in FIG. 1 together with the patterned layers 42a, 42b and 42c. The linear patterns 60a, 60b and 60c have exactly the same shape as that of the underlying polycrystalline silicon layers 42a, 42b and 42c. As shown in FIG. 4, one of the aluminum layers 60 electrically contacts the pad pattern layer 54c having a wide planar area as described above. As a result, the overlying aluminum pattern layers 60 are electrically connected to the underlying pattern layers 42 of polycrystalline silicon through the conductive pad pattern layer 54c. Thus, each word line 16 is constituted by stacking the polycrystalline silicon layer 42 and the aluminum layer 60. In other words, each word line 16 is formed by a multilayer of the polycrystalline silicon layer 42 and the aluminum layer 60.

The contact holes 52 and 58 each formed in the insulative layers 48 and 56 are provided for electrically connecting the two linear layers 42 and 60, which vertically overlap each other so as to constitute the single word line 16. The aluminum pad pattern layer 54c, formed to bury the contact hole 52, is provided to directly contact the two layers 42 and 60 which vertically overlap each other. Therefore, the planar shape of the pattern 54c is set to be larger than that of the contact hole 52, as described above. With this structure, in an actual manufacturing process, if the patterns shift, i.e., positions of the contact holes 52 and 58 shift, the overlying pattern 60 can still be connected to the underlying line pattern 42. The pad patterns (54c) for connecting the lines 42 and 60 are always positioned within dead spaces S of the memory substrate 12 (i.e., regions on which no memory cell is formed), as shown in FIG. 3.

Figure 6:
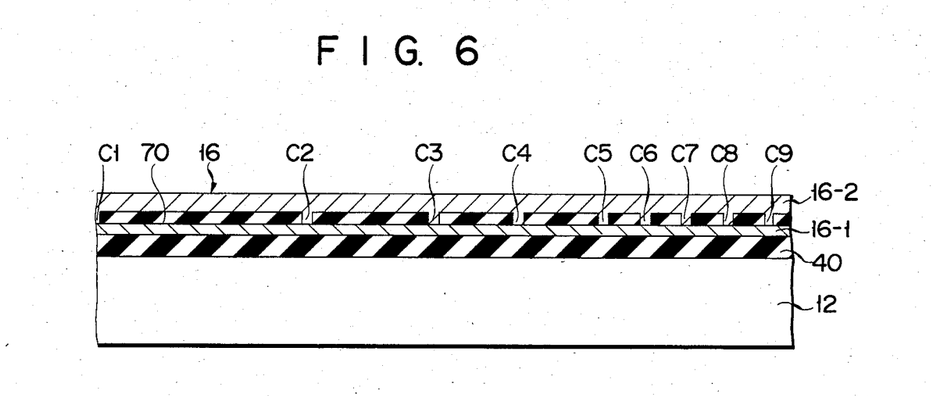
FIG. 6 is a representative illustrating a word line having a double layered structure in which first and second lines are electrically connected to each other through contact holes spaced by irregular intervals.

Each word line 16 of the d-RAM according to one preferred embodiment of the present invention has a multilayered structure (double layered structure) in which two different lines (e.g., polycrystalline semiconductor and a metal) are stacked. In order to easily understand this structure, a description will be continued with reference to FIG. 6. FIG. 6 is a schematic sectional view in which the bit line pattern (in practice, as is apparent from FIG. 4, it is buried in the insulative layer portions 48 and 56 sandwiched between the double layered structure constituting the word line 16) is omitted in order to simplify the following description. The word line 16 comprises a first word line 16-1 of polycrystalline silicon and a second word line 16-2 of aluminum. The first word line 16-1 corresponds to the layer 42 shown in FIGS. 4 (or 5). The second word line 16-2 corresponds to the layer 60 shown in FIGS. 4 (or 5).

The polycrystalline silicon layer 16-1 is electrically isolated from the substrate 12 by the insulative layer 40. The aluminum layer 16-2 is formed above the layer 16-1 so as to sandwich an insulative layer 70 therebetween. The insulative layer section 70 (corresponding to the insulative layers 48 and 56 in the structure of FIGS. 4 or 5) sandwiched between the first and second layers 16-1 and 16-2 has contact holes C1, C2, C3, . . . , C9 (in an "interlayer contact structure" using contact holes, the pad patterns are provided in the same manner as in the structure shown in FIGS. 4 or 5). The first and second layers 16-1 and 16-2 constituting each word line 16 electrically contact each other through the contact holes C1 to C9. It should be noted that a pitch between each two neighbouring contact holes C is set to be irregular. In FIG. 6, the left end of the figure corresponds to the start end portion of the word line 16 and the right end thereof corresponds to the terminal portion of the line 16. The interval or pitch of the contact holes C gradually becomes smaller from the start end portion to the terminal of the word line 16. In other woeds, the intervals between the contact holes C decrease as they approach from the start end of the terminal of the word line 16. In this embodiment, for example, the pitches of contact holes C (distances between the contact points) are set to gradually become smaller as they approach the terminal portion of the word line 16 as follows:

distance D1 between contact points C1 and C2 . . . 2.5P
distance D2 between contact points C2 and C3 . . . 1.5P
distance D3 between contact points C3 and C4 . . . P
distance D4 between contact points C4 and C5 . . . P
distance D5 between contact points C5 and C6 . . . 0.5P
distance D6 between contact points C6 and C7 . . . 0.5P
distance D7 between contact points C7 and C8 . . . 0.5P
distance D8 between contact points C8 and C9 . . . 0.5P
where P is a common contact pitch (corresponding to about 64 bits) when contact points C are provided at equal intervals in a word line when the word line has a length of 5 mm.

According to the above embodiment wherein each word lines 16 has the double layered structure in which two layers contact through contact points spaced apart at gradually decreasing intervals, a signal transfer speed on the word line can be decreased without using a specific conductive material, thus realizing a d-RAM which can perform high-speed accessing. A decrease in the signal transfer speed on the word line can be seen from the graph of delay time characteristics shown in FIG. 7.

Figure 7:
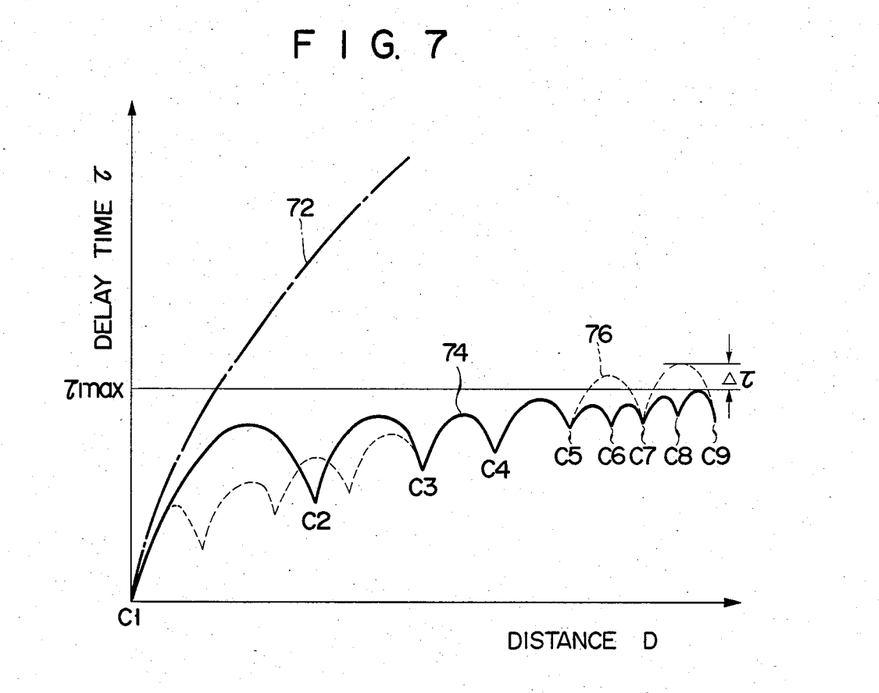
FIG. 7 is a graph of delay time characteristics showing a change in a delay time $\tau$ in signal transfer with respect to a distance D of the word line having the double layered structure according to the present invention.

The graph of FIG. 7 shows voltage delay characteristics when a rectangular wave voltage which rises, e.g., from 0 V to 8 V is applied to the word line 16 as a drive signal. The abscissa of the graph of FIG. 7 represents the distance corresponding to the length of the word line 16, and the right direction thereof is a direction away from the start end portion 17 of the word line 16 and approaching the terminal portion. The positions of the contact points C1 to C9 are illustrated so as to correspond to those in FIG. 6. The ordinate of the graph in FIG. 7 represents a delay time ($\tau$) in signal transfer on the word line 16. In FIG. 7, the curve indicated by the alternate long and short dashed line 72 shows the delay time characteristics of a word line which is constituted only by the polycrystalline silicon line 42 without using the aluminum layer 60 (i.e., a conventional word line of a single layered structure). According to this curve 72, a delay time in the signal transfer with the conventional word line of the single layered structure is considerably increased the further away it is from the start end of the word line due to an increase in the resistance thereof. On the contrary, the delay time characteristics of the present invention obtained under the same conditions as those of the conventional one are represented by a solid curve 74. As shown by the solid curve 74, when the word line 16 comprises the double layered structure, the delay time in signal transfer on the word line can be greatly decreased. For example, when a comparison is made with reference to the contact point C3 of the word line, since the word line 16 of the present invention comprises the double layered structure, the delay time could be reduced to $\frac{1}{3}$ or less that of the single layered conventional word line.

Another important effect can also be obtained with the present invention. In FIG. 7, the delay time characteristics (indicated by a broken curve 76) of the word line of the double layered structure in which two different lines (e.g., polycrystalline semiconductor and a metal) are stacked, and an electrical connection therebetween is formed by contact points spaced by equal intervals are shown as a reference. The following differences can be observed from a comparison between the curves 74 and 76. In the word line 16 with the double layered structure, when the interval or pitch between each two neighbouring contact points C is set to be irregular according to the present invention, a maximum delay time $\tau$max on the same word line can be decreased by $\Delta\tau$. In addition, in a region relatively near the start end of the line (e.g., the contact point C1), the delay time $\tau$ according to the embodiment of the present invention is larger (in other words, the signal transfer speed is degraded). However, this does not adversely influence the delay time in signal transfer on the word line of the d-RAM of the present invention in practice, because the delay time characteristics of the word line are determined by the delay time at the terminal portion of the word line. Therefore, in order to decrease the delay time (i.e., the maximum delay time $\tau$max) at the terminal end portion of the word line which determines the overall delay time characteristics on the word line 16, the interval or pitch between each two neighbouring contact points (C5 to C9) is set to be small. The interval or pitch between two neighbouring contact points (C1 to C3) at the line region near the start end of the word line which does not affect the overall delay time characteristics is set to be large, and the total number of contact points is kept the same (e.g., the same number as that of contact points spaced by the equal pitch; in this embodiment, 9). As a result, a decrease in a memory cell area due to an increase in the number of contact points can be avoided, thus effectively utilizing a cell substrate area.

In this manner, according to the present invention, the total number of contact points between the first and second lines of each word line is set to be constant. Therefore, the delay time in signal transfer can be effectively shortened without decreasing the effective area for memory cells on the substrate. Thus, a semiconductor memory device such as a dynamic RAM which can perform high speed access and has high reliability can be provided.

Figure 8:
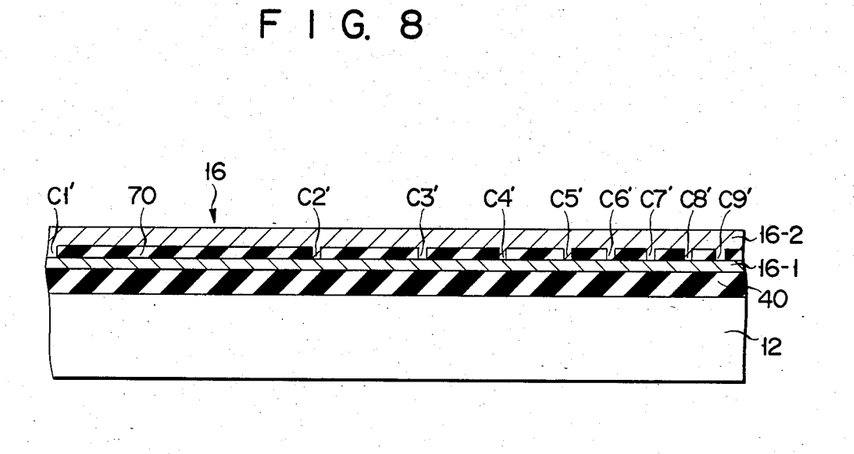
FIG. 8 is an illustration schematically showing a word line having a double layered structure according to a second embodiment of the present invention.

FIG. 8 is a sectional view of a d-RAM including a word line with a double layered structure according to a second embodiment of the present invention. Note that the same reference numerals as in FIG. 6 denote the same parts in FIG. 8, and a detailed description thereof is omitted.

Figure 9:
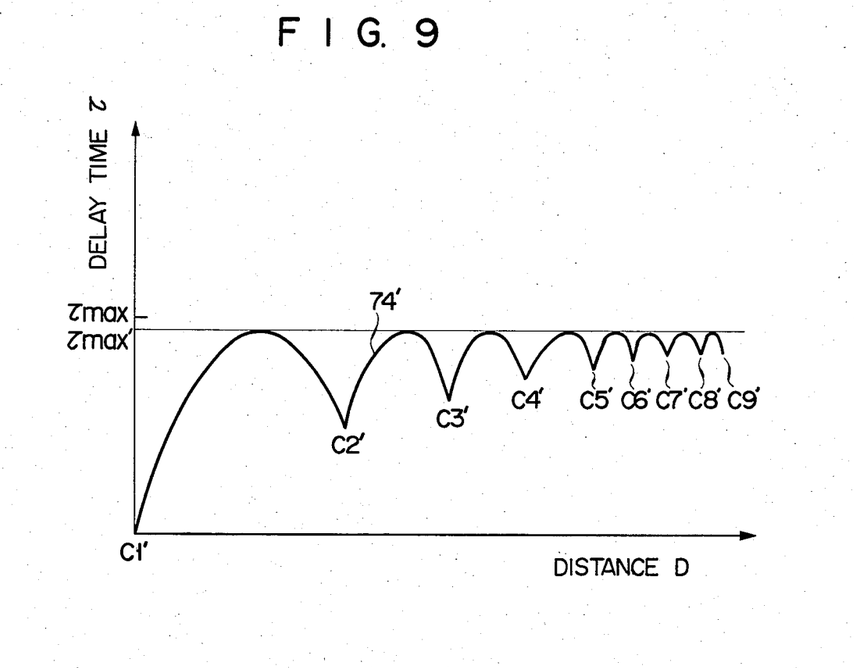
FIG. 9 is a graph of delay time characteristics showing a change in a delay time $\tau$ in signal transfer with respect to a distance D of the word line having the double layered structure according to the second embodiment of the present invention.

In FIG. 8, a word line 16 comprises a first word line 16-1 of polycrystalline silicon and a second word line 16-2 of aluminum in the same manner as in the above embodiment. An insulative layer section 70 sandwiched between the first and second layers 16-1 and 16-2 has contact holes C1, C2, C3, . . . , C9 formed therein. The first and second layers 16-1 and 16-2 constituting the single word line 16 electrically contact through these contact holes C1 to C9. A pitch between each two neighbouring contact holes C is set so that respective peak values of a solid curve 74' of the graph of the delay time characteristics shown in FIG. 9 are equal to a maximum delay time $\tau$max'. In other words, a pitch of contact holes is selected so that a maximum value of the delay time between each pair of contact holes (e.g., C1 and C2, C2 and C3, etc) coincides with the maximum delay time $\tau$max'. In the second embodiment, the pitches of the contact holes C (distances between the contact points) are set as follows:

distance D1' between contact points C1' and C2' . . . 2.94P distance D2' between contact points C2' and C3' . . . 1.47P distance D3' between contact points C3' and C4' . . . 0.98P distance D4' between contact points C4' and C5' . . . 0.74P distance D5' between contact points C5' and C6' . . . 0.59P distance D6' between contact points C6' and C7' . . . 0.49P distance D7' between contact points C7' and C8' . . . 0.42P distance D8' between contact points C8' and C9' . . . 0.37P where P is a common contact pitch when contact points C are provided at equal intervals in a word line having a length of 5 mm.

According to the second embodiment wherein the word line 16 of the present invention has a double layered strucuture in which two layers contact through contact points whose pitch is gradually decreased, a signal transfer speed on the word line can be decreased. The reasons for this are as follows:

(i) the distance or pitch between each two neighbouring contact points at a line region near the start end of the word line which does not influence the overall delay time characteristics on the word line of the d-RAM is set to be maximum within the range which does not change the total number of contact points; and (ii) the distance or pitch between each two neighbouring contact points at a line region near the terminal end of the word line, which greatly influences the overall delay time characteristics, is set to be as small as possible. As a result, the delay time in signal transfer can be shortened and an effective area of the cell substrate is maintained, thereby providing a semiconductor memory device such as a dynamic RAM which can perform high speed access and has high reliability.

Although the present invention has been shown and described with reference to particular embodiments, various changes and modifications which are obvious to a person skilled in the art to which the invention pertains are deemed to lie within the scope of the invention.

What is claimed is:

1. A semiconductor memory device comprising:
   (a) a semiconductor substrate;
   (b) a plurality of memory cells, which are formed on said semiconductor substrate, each having a memory cell transistor and a memory cell capacitor which is charged so as to reflect the logic state of its memory cell; and
   (c) address lines which extend in row and column directions on said semiconductor substrate and select a particular memory cell for reading/writing data from/in the desired memory cell, said address lines including double layered address lines each of which comprises,
   (i) first and second conductive lines of linear shapes each of which has a first end portion for receiving a voltage signal for selecting the particular memory cell and a second end portion at an opposite side of said first end portion, which are stacked, and which extend in one of the row and column directions, and
   (ii) a linear insulative layer which extends along an extending direction of said first and second conductive lines, is sandwiched between said first and second conductive lines, has contact holes formed along the extending direction of said first and second conductive lines, and allows electrical connection between said first and second conductive lines through the contact holes, an interval of two neighbouring contact holes at the second end portion of each of said first and second conductive lines being set to be smaller than that of two neighbouring contact holes at the first end portion of each of said first and second conductive lines, thereby decreasing the maximum delay time in signal transfer at the second end portion of each of said double layered address lines, and the interval between two neighbouring contact holes at the first end portion of each of said first and second conductive lines is increased, thereby avoiding an increase in the total number of contact holes.

2. The device according to claim 1, wherein said first conductive line comprises a polycrystalline silicon connected to said memory cell transistors formed on said semiconductor substrate, and said second conductive line comprises a metal layer.

3. The device according to claim 2, wherein the contact holes are formed in said linear insulative layer such that an interval between each two neighbouring contact holes is decreased from the first end portion to the second end portion of each of said double layered address lines.

4. The device according to claim 3, wherein the interval between each two neighbouring contact holes among the contact holes is selected in such a manner that a plurality of delay time peak values in signal transfer of said double layered address lines obtained between each two neighbouring contact holes coincide with a predetermined delay level, whereby the maximum delay time in signal transfer of said memory device can be minimized while avoiding an increase in the total number of the contact holes.

5. The device according to claim 4, wherein said double layered address lines correspond to word lines in said memory device.

* * * * *